US010672443B2

(12) United States Patent
Gupta et al.

(10) Patent No.: US 10,672,443 B2
(45) Date of Patent: Jun. 2, 2020

(54) METHODS AND SYSTEMS FOR PERFORMING DECODING IN FINFET BASED MEMORIES

(71) Applicant: SAMSUNG ELECTRONICS CO., LTD., Suwon-si (KR)

(72) Inventors: Ankur Gupta, Bangalore (IN); Abhishek Kesarwani, Bangalore (IN); Parvinder Kumar Rana, Bangalore (IN); Manish Chandra Joshi, Bangalore (IN); Lava Kumar Pulluru, Bangalore (IN)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 0 days.

(21) Appl. No.: 16/166,647

(22) Filed: Oct. 22, 2018

(65) Prior Publication Data
US 2020/0075070 A1    Mar. 5, 2020

(30) Foreign Application Priority Data

Aug. 29, 2018  (IN) .............................. 201841032433

(51) Int. Cl.
| G11C 8/10 | (2006.01) |
| G11C 7/22 | (2006.01) |
| G11C 8/06 | (2006.01) |
| G11C 8/08 | (2006.01) |
| G11C 17/12 | (2006.01) |
| G11C 11/418 | (2006.01) |
| G11C 11/417 | (2006.01) |

(52) U.S. Cl.
CPC ................ *G11C 8/10* (2013.01); *G11C 7/222* (2013.01); *G11C 8/06* (2013.01); *G11C 8/08* (2013.01); *G11C 11/417* (2013.01); *G11C 11/418* (2013.01); *G11C 17/12* (2013.01)

(58) Field of Classification Search
None
See application file for complete search history.

(56) References Cited

U.S. PATENT DOCUMENTS 5,587,959 A * 12/1996 Tsukude .................. G11C 8/12
                                                                365/230.06
6,366,524 B1 * 4/2002 Abedifard ............ G11C 7/1072
                                                                365/230.03

(Continued)

*Primary Examiner* — Douglas King
(74) *Attorney, Agent, or Firm* — Sughrue Mion, PLLC

(57) ABSTRACT

A fin-Field Effect Transistor based system on chip (SoC) memory is provided and includes a control block, first logic gates, and row decoder blocks. The control block includes a clock generator circuit that generates an internal clock signal, and a global driver circuit coupled to the clock generator circuit that drives a global clock signal. Each row decoder block includes a second logic gate that receives higher order non-clocked address signals via input terminals, a transmission gate that combines the global clock signal and the higher order non-clocked address signals, third logic gates that receive lower order non-clocked address signals and higher order clocked address signals, and output a combined lower order address and higher order address along with the global clock signal, level shifter circuits that receive the outputs, and word-line driver circuits that generate word-lines based on the output of the level shifter circuits.

20 Claims, 10 Drawing Sheets

(56) References Cited

U.S. PATENT DOCUMENTS

| 9,032,352 B2 | 5/2015 | Bhattacharya et al. | |
|---|---|---|---|
| 2002/0027823 A1* | 3/2002 | Watanabe | G11C 8/12 365/230.03 |
| 2007/0081413 A1* | 4/2007 | Koo | G11C 8/06 365/230.06 |

* cited by examiner

METHODS AND SYSTEMS FOR PERFORMING DECODING IN FINFET BASED MEMORIES

CROSS-REFERENCE TO RELATED APPLICATIONS

This Application claims priority from Indian Patent Application No. 201841032433, filed on Aug. 29, 2018 in the India Patent Office, the entire disclosure of which is herein incorporated by reference in its entirety.

TECHNICAL FIELD

The present disclosure relates to the field of semiconductor memory devices and more particularly to Fin Field Effect Transistor (FinFET) based semiconductor memory devices including at least one row decoder that controls the operation of word lines.

BACKGROUND

Currently, on-chip memories may consume a large area in system on chip. In general, the system on chip memories, such as a SRAM (Static Random Access Memory) may be used for different levels of cache memories, a ROM (Read only Memory) may be used in processors for storing instruction set, and a RF (Register Files) may be used within multi-core processors. Further, the memory chip such as SRAM, ROM, and RF may include at least two types of hardware circuits such as bit-cell array circuits and periphery circuits. The bit-cell array may circuits include an array of bit-cells, which store 1-bit of data in each cell and the periphery circuits may include logic gates to control read and write operations. In general, fin-FET (fin-Field Effect Transistor) technology may have performance issues with respect to on-chip memories. For example, device gate capacitance may be high compared to planar CMOS (Complementary Metal Oxide Semiconductor) nodes, wherein the nodes (also technology nodes, process node, process technology or simply node) refer to a specific semiconductor manufacturing process and its design rules. In another example, resistance may be much higher in advanced nodes such as finFET, which may limit the overall performance of the SoC. In yet another example, an area of memory may be limited by width of metal tracks, wherein the metal tracks may be used to transmit the address signals, clock signals and so on. Accordingly, the performance of on-chip memory (such as SRAM, RF or ROM) may be determined by at least one of cycle time and access time. The access time may also include the time for decoding a word-line.

SUMMARY

It is an aspect to provide methods and systems for decoding in finFET based SoC memory devices.

It is another aspect to provide methods and systems for at least one row decoders.

It is another aspect to provide methods and systems for reducing the access time for reading and writing operation of the address in system on chip memories.

It is another aspect to provide methods and systems for reducing device capacitance.

It is another aspect to provide methods and systems for reducing resistance in advanced nodes.

It is another aspect to provide methods and systems for reducing the metal tracks within the finFET based SoC memory.

It is another aspect to provide methods and systems for performance area gain.

According to an aspect of one or more embodiments, there is provided a fin-Field Effect Transistor (fin-FET) based system on chip (SoC) memory comprising a control block comprising a clock generator circuit configured to generate an internal clock signal using an external clock signal received via an input node; a global driver circuit coupled to the clock generator circuit and configured to drive a global clock signal corresponding to the internal clock signal; and a plurality of first logic gates configured to receive a plurality of lower order non-clocked address signals via at least one input terminal associated with the plurality of first logic gates, wherein the plurality of lower order address signals are non-clocked address signals; and a plurality of row decoder blocks configured to receive an input from the control block, each of the plurality of row decoder blocks comprising a second logic gate configured to receive a plurality of higher order non-clocked address signals via a plurality of input terminals associated with the second logic gate; a transmission gate configured to combine at least two of the global clock signal and the plurality of higher order non-clocked address signals, wherein the global clock signal is received via the global driver circuit and the plurality of higher order non-clocked address signals is received via the second logic gate; a plurality of third logic gates configured to receive at least two of the plurality of lower order non-clocked address signals and a plurality of higher order clocked address signals, to output a combined lower order address and higher order address along with the global clock signal, wherein the plurality of lower order non-clocked address signals is received via the plurality of first logic gates and the plurality of higher order clocked address signal is received via the transmission gate; a plurality of level shifter circuits configured to receive the outputs of the plurality of third logic gates, and configured to output at least one of a translated logic level and a translated voltage level; and a plurality of word-line driver circuits configured to generate a plurality of word-lines based on the output of plurality of level shifter circuits.

According to another aspect of one or more embodiments, there is provided a method for performing decoding in a fin-Field Effect Transistor (fin-FET) based system on chip (SoC) memory, the method comprising generating, by a clock generator circuit, an internal clock signal; driving, by a global driver circuit, a global clock signal corresponding to the internal clock signal; receiving, by a plurality of first logic gates, a plurality of lower order non-clocked address signals via at least one of an input terminal associated with the plurality of first logic gates; receiving, by a second logic gate, a plurality of higher order non-clocked address signals via a plurality of input terminals associated with the second logic gate; controlling, by the second logic gate, a pass logic corresponding to a higher order non-clocked address signal outputted by the second logic gates; combining, by a transmission gate, the at least two of the global clock signal and the higher order non-clocked address signal; receiving, by a plurality of third logic gates, at least two of the plurality of lower order non-clocked signals and the plurality of higher order clocked address signal; combining, by the plurality of third logic gates, the received at least two of plurality of lower order non-clocked signals and a higher order clocked signal; level shifting, by a plurality of level shifter circuits, the combined address signal via the plurality of third logic gates; and generating, by a plurality of word-line driver circuits, plurality of word-lines based on the level shifted address signal received via the plurality of level shifter circuits.

BRIEF DESCRIPTION OF THE DRAWINGS

Example embodiments herein are illustrated in the accompanying drawings, throughout which like reference letters indicate corresponding parts in the various figures. The example embodiments herein will be better understood from the following description with reference to the drawings, in which.

DETAILED DESCRIPTION

The example embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the example embodiments herein. The description herein is intended merely to facilitate an understanding of ways in which the example embodiments herein may be practiced and to further enable those of skill in the art to practice the example embodiments herein. Accordingly, this disclosure should not be construed as limiting the scope of the example embodiments herein. In the present specification, the phrase "at least one of A and B" includes "only A", "only B", and "both A and B".

A semiconductor memory device having word line structure according to the related art will be described, referring to FIGS. 1 to 2B, as follows.

Figure 1:
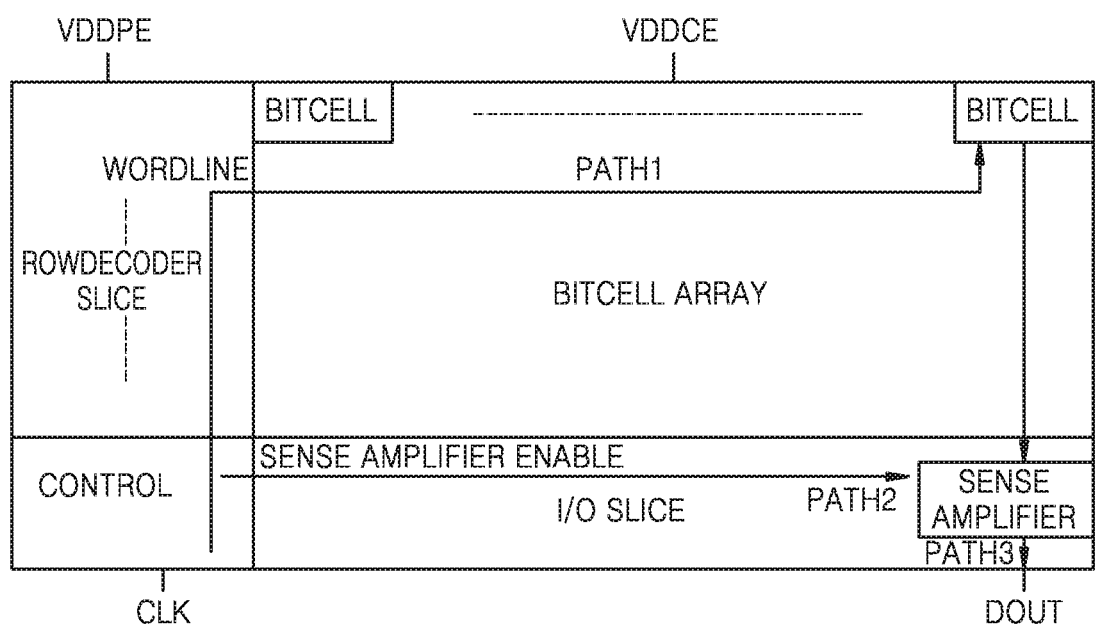
FIG. 1 illustrates a schematic diagram of access time from the data-path to/from the cell in system on chip memories.
Figure 2A:
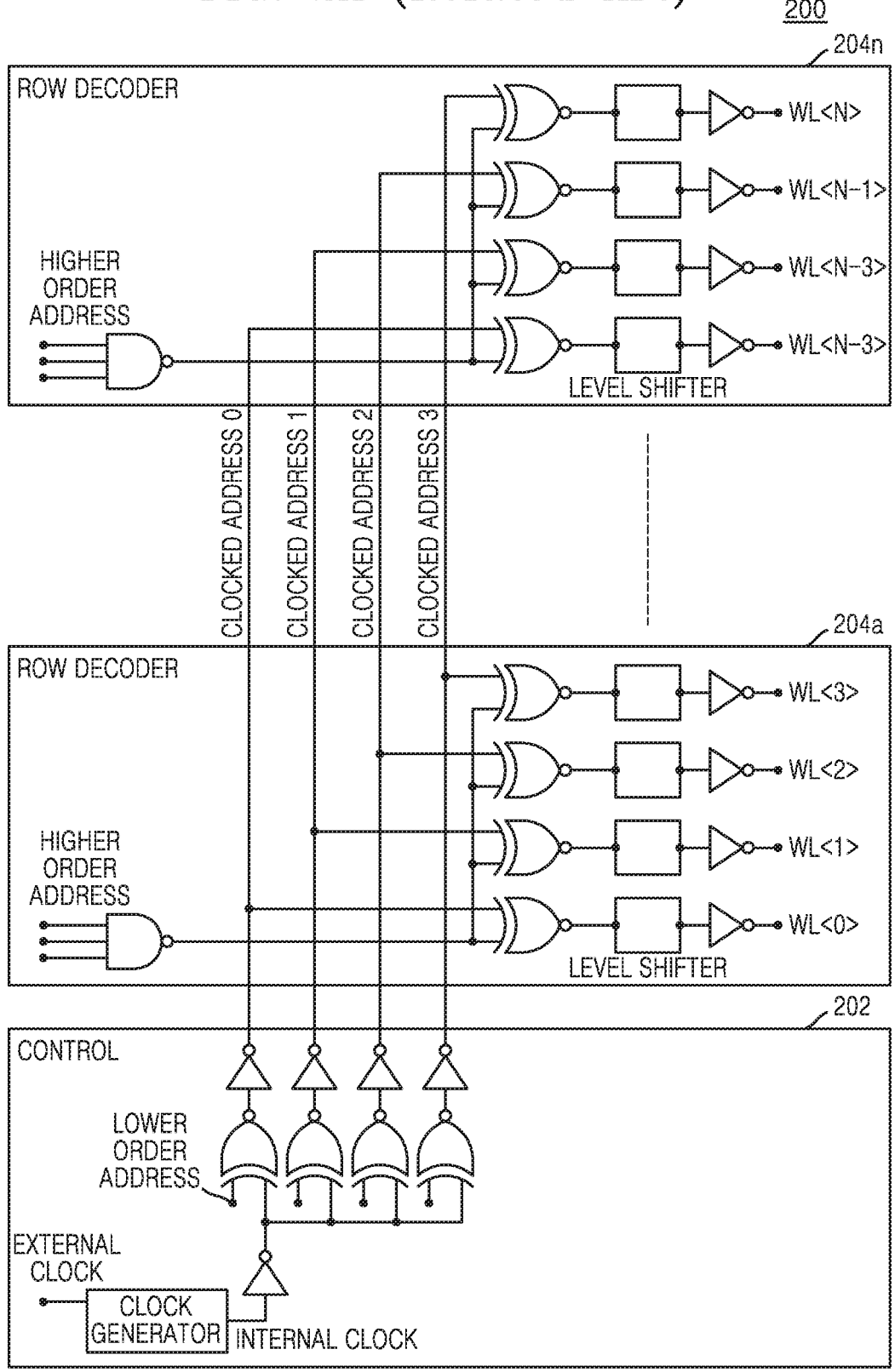
FIGS. 2A and 2B illustrates a circuit diagram of a related art fin-Field Effect Transistor (finFET) based system on chip (SoC) memory implemented in system on chip.
Figure 2B:
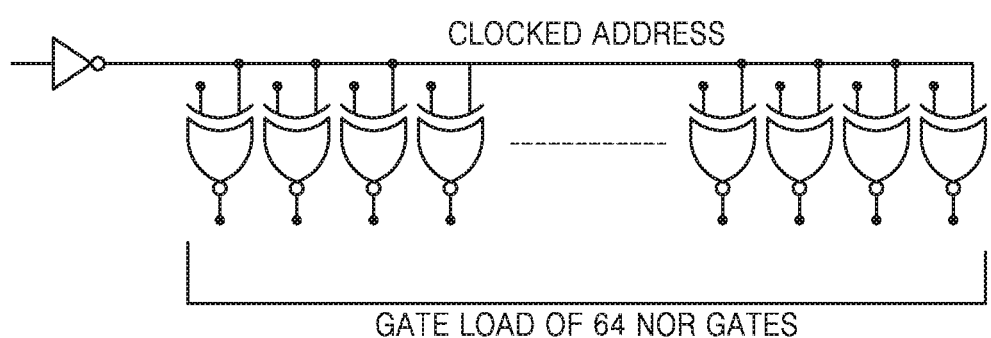

FIG. 1 illustrates a schematic diagram of access time from the data-path to/from the cell in system on chip memories. The access time may be calculated based on the time taken along the path for read operations in memories. The different data-path to/from the cell may be, a clock to word-line decoding path (i.e. PATH1), word-line decoding to sense generation path (i.e. PATH2) and sense generation to output path (i.e. PATH3). The time consumed for each path may be approximately, 40% for clock to word-line decoding, 40% for word-line decoding to sense generation, 20% sense generation to output FIGS. 2A and 2B illustrate a circuit diagram of related art finFET based SoC memory 200 implemented in system on chip. The related art finFET based SoC memory 200 may include different blocks such as a control block 202 and a plurality of row-decoder 204a-n blocks. The control block 202 may include a clock generator and logic gates for lower order address. Further, the row decoder blocks 204a-n may include word-line driver circuit and logic gates for receiving higher order address. Further, the clock generator may generate an internal clock and transmit the generated clock to the logic gates in the control block 202. The logic gates in the control block 202 may combine the lower order address signal and the internal clock signal.

A global driver may also be included to drive the lower order clocked address signal to the row decoder block 204a-n. The higher order address may be combined with the global clock signal received via the global driver. The higher order address is received via a logic gate of the row decoder block 204a-n. Further, the higher order address and the clocked lower order address is combined through a plurality of logic gates as shown in FIG. 2A. The output of plurality logic gates may drive the level shifter circuits. Furthermore, the plurality of word-line drivers may generate the word-line. The address may be controlled in the control block 202 of the related art finFET based SoC memory 200.

Further, due to high gate capacitance, the row decoder blocks 204a-n may require at least four internal clock signals to distribute the load. Also, the internal clock signal may have high capacitance due to gate load (NOR gate) of plurality of logic gates in the row decoder block 204a-n. For example, the capacitance due to gate load associated with plurality of the logic gates may be 75 fF (femto Farad). The total device gate capacitance per row-decoder block 204a-n may be 0.54 fF and the total parasitic capacitance per row-decoder block 204a-n may be 0.64 fF. Further, the total capacitance per row-decoder block 204a-n may be 1.18 fF. Moreover, four global drivers may be required for the lower order clocked address and four wide metal tracks may be required for driving the clock, wherein the wide metal tracks may be used to minimize resistance. Also, the total path delay may be measured as a six gate delay, wherein first gate delay is at inverter stage which is placed after the clock generator circuit. The second gate delay is at global driver stage after the logic gates in control block 202. The third gate delay may be at logic gates for lower order address in control block 202. The fourth gate delay is at plurality of logic gates in row decoder blocks 204a-n and the fifth gate delay is at level shifters stage in row decoder block 204a-n. The sixth delay is at word-line driver stage in row decoder block 204a-n.

The example embodiments herein achieve methods and systems for decoding in finFET based SoC memory devices by using plurality of transmission gates to reduce gate load and path delay. Referring now to the drawings, and more particularly to FIGS. 3A through 8C, where similar reference characters denote corresponding features consistently throughout the figures, there are shown various example embodiments.

Figure 3A:
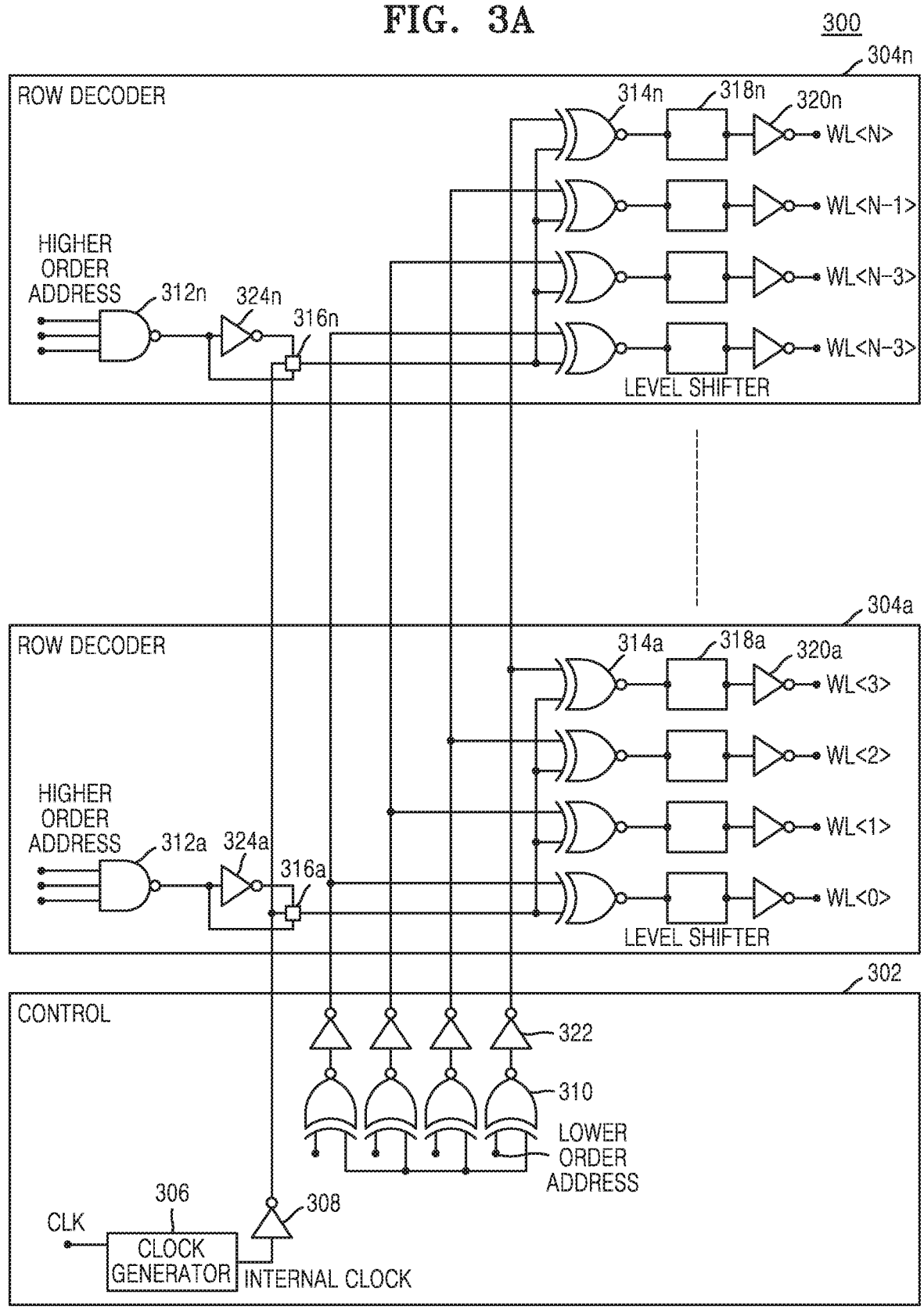
FIGS. 3A and 3B illustrates a circuit diagram of finFET based SoC memory implemented in a finFET based system on chip (SoC), according to example embodiments.
Figure 3B:
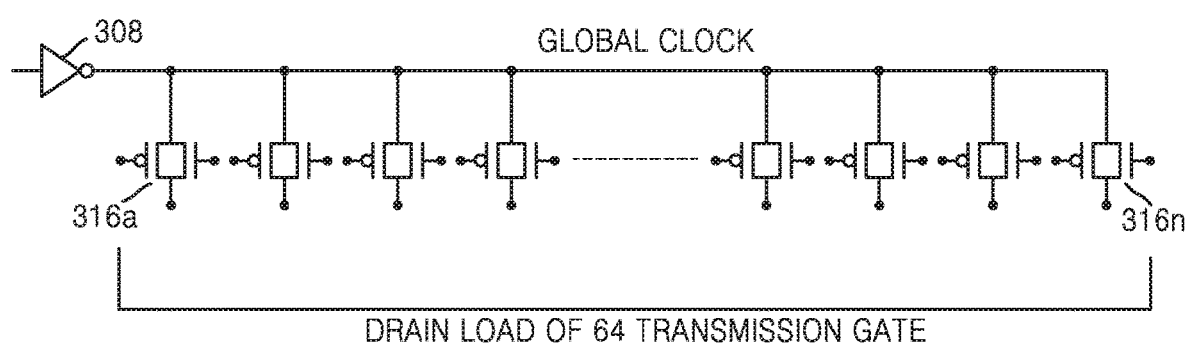

FIGS. 3A and 3B illustrates a circuit diagram of finFET based SoC memory 300 implemented in finFET (fin-Field Effect Transistor) based system on chip (SoC), according to example embodiments.

In accordance with the example embodiments disclosed herein, a memory system, such as a Static Random Access Memory (SRAM), may include a plurality of memory cells and a finFET based SoC memory 300 coupled to the memory cells. The finFET based SoC memory 300 may provide a word-line signal to one or more of the memory cells, to allow access to the one or more memory cells for a read operation or a write operation. For example, the read and write operation signal such as a RWL signal and a WWL signal may be generated by the finFET based SoC memory 300 based on whether a read operation or a write operation is to be performed in the next cycle. The finFET based SoC memory 300 may include a buffer having an input for receiving the WWL signal and an output for outputting the WWL signal. The finFET based SoC memory 300 may activate the word-line signal based on the RWL signal and the WWL signal. Further, the operation allows the same circuitry (e.g., decode/pre-charge/word-line) to be used for both the read operation and the write operation.

The write word-lines and read word-lines may be formed in a single metal track. The word-line driver 320a-n may be included as part of a repeating group of cells and may be utilized in the Random Access Memory (RAM). Examples of the RAM may be, but not limited to Static Random Access Memory (SRAM) devices, Register Files (RF), Read Only Memory (ROM), other integrated circuits along with SRAM and so on. The integrated circuit provided in accordance with interconnection techniques of embodiments herein, may be employed in essentially any application and/or electronic system utilizing memory, without regard to whether the memory is embedded or standalone (e.g., discrete memory). Examples of suitable systems for implementing the example embodiments herein may include, but not limited to, personal computer(s), communication network(s), portable communications device(s) (e.g., mobile, smart phones), multi-user computing apparatus, workstation(s), play station(s), graphics system(s), camera(s), embedded control system(s), Internet of Things (IoT) devices, vehicle infotainment systems, and so on.

Examples of memory includes at least one of, but not limited to, a static RAM (SRAM), a dynamic RAM (DRAM), a Synchronous Dynamic RAM (SDRAM), a Dual In-line Memory Module (DIMM), a Small Outline In-line Memory Module (SO-DIMM), a Video RAM (VRAM), a double-data-rate memory (DDR), a Graphics DDR (GDDR), Error-correcting code memory (ECC), Content Addressable Memory (CAM), Register Files (RF), a First in First Out (FIFO) memory management, a Read only Memory (ROM), a cache memory, a volatile memory, a non-volatile memory, a flash memory, a solid-state memory, a optical RAM, and so on.

Although, the example embodiments described herein may be implemented using finFETs, which may be formed using a CMOS (Complementary Metal Oxide Semiconductor) fabrication process, it is to be appreciated that example embodiments herein, are not limited to such transistor devices and/or such a fabrication process, and the other suitable devices, such as, for example, finFETs, bipolar junction transistors (BJTs), etc., and/or fabrication processes (e.g., bipolar, BiCMOS, etc.), may be similarly employed, with or without modification to the integrated circuits as described in the example embodiments herein. Moreover, although example embodiments herein are typically fabricated in a silicon wafer, example embodiments herein may alternatively be fabricated in wafers comprising other materials, including but not limited to Gallium Arsenide, Indium Phosphide, and so on.

Accordingly, the system on chip according to an example embodiment herein may include a first power circuit (not shown), a second power circuit (not shown), a power controller (not shown) and an SRAM (not shown), and so on. Further, the first power circuit may generate a cell driving voltage VDDCE (as shown in FIG. 1). The cell driving voltage VDDCE is a voltage for driving memory cells of the SRAM. The first power circuit may generate the cell driving voltage VDDCE using an internal voltage of the system on chip or may use a voltage provided from an external device (not shown). Furthermore, if the voltage is supplied from external device is lower than the cell driving voltage VDDCE, then the first power circuit may generate the cell driving voltage VDDCE using a boosting circuit (not shown), such as a charge pump circuit and so on. Moreover, if the voltage supplied from the external device is higher than the cell driving voltage VDDCE, then the first power circuit may generate the cell driving voltage VDDCE using a down converting circuit (not shown).

The second power circuit may generate a peripheral driving voltage VDDPE (as shown in FIG. 1). The peripheral driving voltage VDDPE is a voltage for driving control circuits except for the memory cells of the SRAM. Further, the second power circuit may generate the peripheral driving voltage VDDPE, which may vary according to a performance mode. For example, the second power circuit may generate a relatively high peripheral driving voltage VDDPE when the performance mode indicates a high-speed mode. The second power circuit may generate a relatively low peripheral driving voltage VDDPE when the performance mode indicates a low-speed mode.

Further, the power controller may initiate the performance mode in response to a performance control signal. On initiating the performance mode, information about the performance mode may be provided to the second power circuit and the SRAM. For example, high-speed data processing may be used when processing a video signal using the system on chip. Further, the performance control signal may be provided for a high-speed operation. Low-speed data processing may be used when processing an audio signal using the system on chip.

The SoC memory may further include level shifter circuits, row decoders (RDEC), control blocks, control inputs, data inputs, data outputs and an input/output (TO) block (as shown in FIG. 3A). The SoC memory may be implemented so that the RDEC and the control block may operate at a higher voltage VDDPE, while the bit-cell array may operate at VDDCE and the I/O block may operate at a lower voltage VDDPE relative to one another. However, the example embodiments herein are not limited to any specific voltage levels for VDDPE or VDDCE. Further, the level shifter circuits may operate at both VDDPE and VDDCE voltage levels. The voltage level shifters may also convert voltages in the higher power supply domain to voltages in the lower power supply domain, and vice versa. For example, the level shifter circuits 318a-n may be placed at the outputs of the input receivers/buffers, and the level shifter circuits may be placed at the inputs of the output drivers. Also, the clock generator circuit 306 may be adapted for the SoC memory for generating an internal clock. The internal clock may serve as the input clock to the memory block.

Accordingly, the finFET based SoC memory 300 implemented in finFET (fin Field Effect Transistor) based system on chip (SoC) memory may also be implemented in memory compilers. The memory compiler may include software for the automatic generation of static memory circuits (SRAMs) based on parameters that are set. The memory compiler may generate a range of SRAMs with different output data formats for integrating memory into a design. The memory compiler may also generate an automatic layout of memory elements in the ASIC environment. The memory compiler may generate SRAM layout based on a given SRAM size, input, with the option of choosing between fast vs. low-power SRAM. Further, the memory compiler may generate an SRAM without array-partitioning. The arrays may be arranged in rows and columns of memory cells called word-lines and bit-lines, respectively. Each memory cell may have a unique location or address defined by the bit line and word line.

Accordingly, the row decoder 304a-n decodes a single word line, while the column decoder (not shown) decodes a block of bit-lines. In an example, if a word of 8 bits is to be read from location (i, j). Then the row decoder 304a-n may activate the word-line 'i' and the column decoder may connect all bit-lines in block T to sense amplifiers, wherein the block 'j' may also include 8 columns. Further, a signal may be used to indicate that the SRAM is currently being accessed and controls the word-line (row) decoders. Thus, when the signal is off, none of the word-lines are on. The inverters (as shown in FIG. 3A) may store the signal and may be maintained as long as power is available. Also, the sense amplifiers may be used to recover from the performance losses. Each row decoder 304a-n may generate complemented address signals, which may be used by the word-line driver 320a-n.

The finFET based SoC memory 300 may be implemented for high speed memories in finFET technology. The finFET based SoC memory 300 may be implemented using the different interconnection techniques and with the same circuit components. Some of the examples of finFET based SoC memory 300 are implemented as shown in embodiments herein.

Referring to FIG. 3A, the finFET based SoC memory 300 may include a control block 302 and plurality of row decoder blocks 304a-n, wherein the plurality of row decoder blocks 304a-n may be configured to control the plurality of address signals. The control block 302 may include a clock generator 306, a global driver circuit 308, a plurality of first logic gates 310, and a plurality of inverters 322.

In an example embodiment, the clock generator circuit 306 may be configured to generate an internal clock signal, wherein the clock generator circuit 306 may receive an external clock signal via an input node, to generate the internal clock signal from the external clock signal. The clock generator circuit 306 may be operative to receive a rising edge of the external clock signal and to generate an internal clock signal. The output of the clock generator circuit 306 may have a pulse width independent of a pulse width of the external clock signal.

In another example embodiment, the global driver circuit 308 is coupled to the clock generator circuit 306 via a single metal track and may be configured to drive a global clock signal corresponding to the internal clock signal generated by the clock generator circuit 306. The global driver circuit 308 may include an inverter driver. The global driver circuit 308 drives the global clock signal throughout the row decoder blocks 304a-n.

In yet another example embodiment, the plurality of first logic gates 310 may be configured to receive plurality of lower order non-clocked address signals via at least one of an input terminal associated with the plurality of first logic gates, wherein the plurality of lower order address signals are non-clocked address signals. The first logic gates 310 may be a logic gate such as NOR gate. The output of NOR gate is the complemented sum of the lower order address. The plurality of inverters 322 coupled after the plurality of the first logic gates 310 may invert the complemented lower order non-clocked address signals.

In an example embodiment, a plurality of row decoder blocks 304a-n placed adjacent to each other may be configured to receive input from the control block 302. The plurality of row decoder blocks 304a-n includes, second logic gates 312a-n, a transmission gate 316a-n, third logic gates 314a-n, a plurality of level shifters 318a-n, and a plurality of word-line driver circuits 320a-n. In an example embodiment, the second logic gate 312a-n may be configured to receive a plurality of higher order non-clocked address signals via plurality of an input terminal associated with the second logic gate 312a-n. The second logic gates 312A-n may be a logic gate such as a NAND gate. The second logic gates 312a-n may also be referred to herein as NAND gate 312a-n.

Accordingly, the higher order address bits are applied to NAND gates 312a-n, which may provide signals at an output when the memory is addressed. Each of NAND gates 312a-n may include a plurality of inputs, wherein the inputs may differ depending upon the relative size and addressing capability of memory. The second logic gates 312a-n may provide an output when each of the inputs is at a high logic level. The output of the second logic gates 312a-n may be a complement of higher order non-clocked address signals.

In an example embodiment, the transmission gate 316a-n may be configured to combine at least two of the global clock signal and the higher order non-clocked address signal, wherein the global clock signal is received via the global driver circuit 308 and the higher order non-clocked address signal is received via the second logic gate 312a-n. The higher order non-clocked address signal may control an inverter 324a-n. The higher order address (clocked and non-clocked) may include different versions of complemented address, for controlling the pass gate or transmission gate 316a-n. The transmission gate 316a-n may also be configured to selectively output the higher order address signal. The transmission gate 316a-n may be controlled according to the output from the second logic gate 312a-n and an output from the inverter 324a-n. In an example embodiment, the transmission gate 316a-n may be configured to receive high order non-clocked address signal via at least two of input terminal associated with the transmission gate 316a-n. The pass gate or transmission gate 316a-n may be controlled using the higher order address signal based on the received clock signal. In another example embodiment, the transmission gate 316a-n may be configured to receive the global clock signal via a drain terminal associated with the transmission gate 316a-n.

In another example embodiment, the plurality of third logic gates 314a-n may be configured to receive at least two of plurality of lower order non-clocked address signals and a higher order clocked address signals, wherein the lower order non-clocked address signals is received via the first logic gates 310 and the higher order clocked address signals is received via the transmission gate 316a-n. The third logic gates 314a-n may be a NOR gate. The third logic gates 314a-n may provide a complemented output of the combined lower order address and higher order address. The lower order non-clocked address signals are transmitted to the plurality of third logic gates 314a-n via a plurality of global driver circuits (as shown in FIG. 3A).

In an example embodiment, the plurality of level shifter circuits 318a-n may be configured to receive the output of the plurality of third logic gates 314a-n, wherein the plurality of level shifter circuits 318a-n may be configured to translate at least one of a logic level and a voltage level.

In another example embodiment, the plurality of word-line driver circuits 320a-n may be configured to generate plurality of word-lines based on the output of plurality of level shifter circuits 318a-n. The block may be selected by the row decoder 304a-n, wherein the word line may be provided at a logic high if pre-decoded inputs are a logic high such as combined address signals. The plurality of word-line drivers 320a-n may receive the pre-decoded signals from plurality of third logic gates 314a-n in row decoder blocks 304a-n. The word line driver may include a stack of transistors. The stack transistors may include at least one of a plurality of decode transistors, a pull up transistor, an inverting circuit, and so on.

Referring to FIG. 3B, the figure shows multiple transmission gates 316a-n connected to the global clock. The multiple transmission gates 316a-n may be placed in each row decoder block 304a-n respectively.

Figure 4:
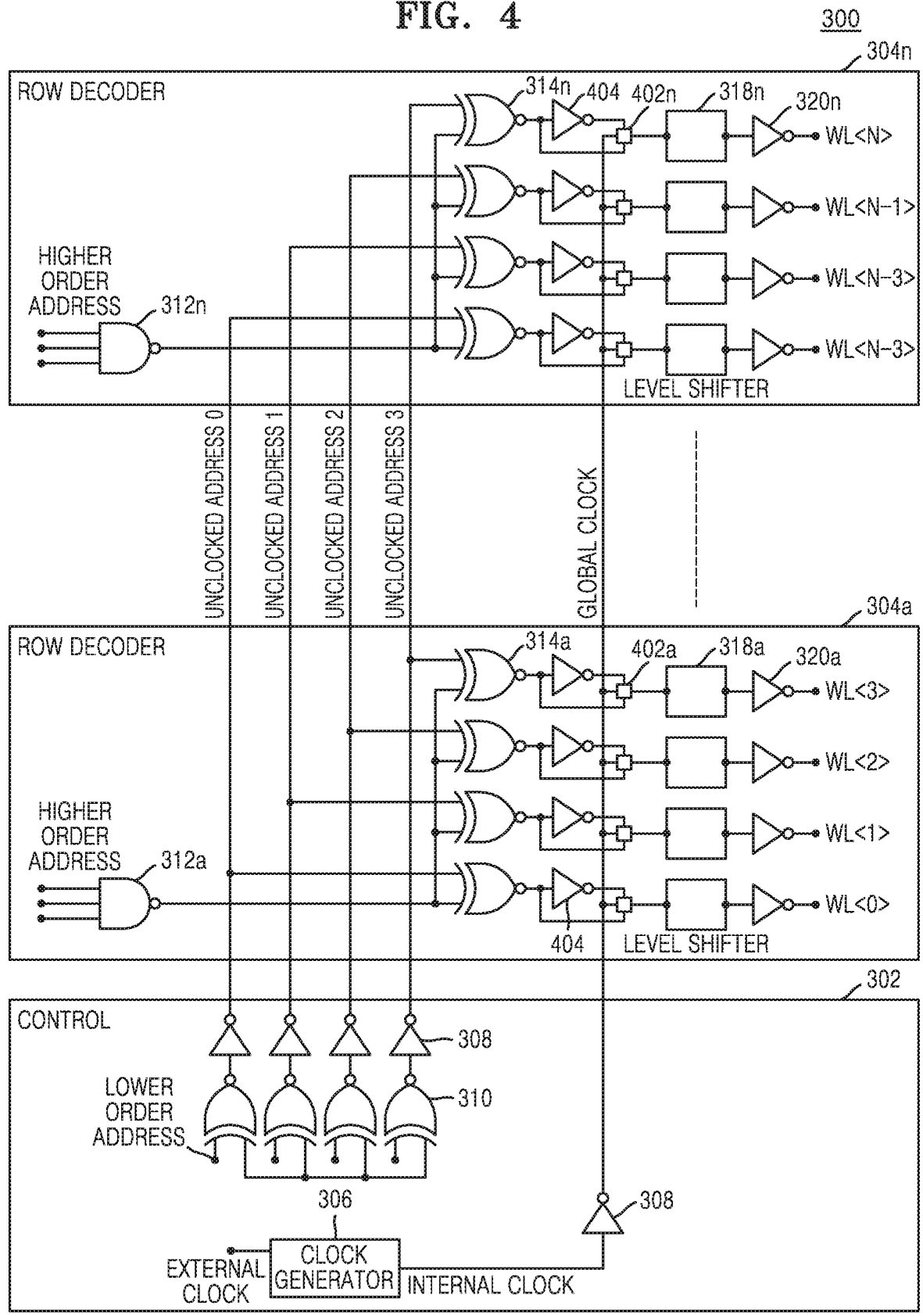
FIG. 4 illustrates a circuit diagram of finFET based SoC memory implemented using transmission gates, after combing lower order address signals with higher order address signals, according to example embodiments.

FIG. 4 illustrates a circuit diagram of finFET based SoC memory 300 implemented using plurality of transmission gates 402a-n, after combing lower order address signals with higher order address signals, according to example embodiments. In an example embodiment, a plurality of transmission gates 402a-n may be configured to receive at least two of global clock signal and a plurality of address signals, wherein the plurality of address signals comprises a plurality of lower order non-clocked address signals and a higher order non-clocked address signal.

In another example embodiment, the plurality of word-line driver circuits 320a-n may be configured to generate the plurality of word-lines based on the controlled address signals received via the transmission gates 402a-n and the level shifter circuits 318A-n. In another example embodiment, the plurality of controlled address signals is received via the third logic gates 314a-n. In yet another example embodiment, the plurality of lower order non-clocked address signals is received, by the third logic gates 314a-n, via the first logic gates 310. In another example embodiment, the higher order non-clocked address signal is received, by the third logic gates 314a-n, via the second logic gate 312a-n.

Figure 5:
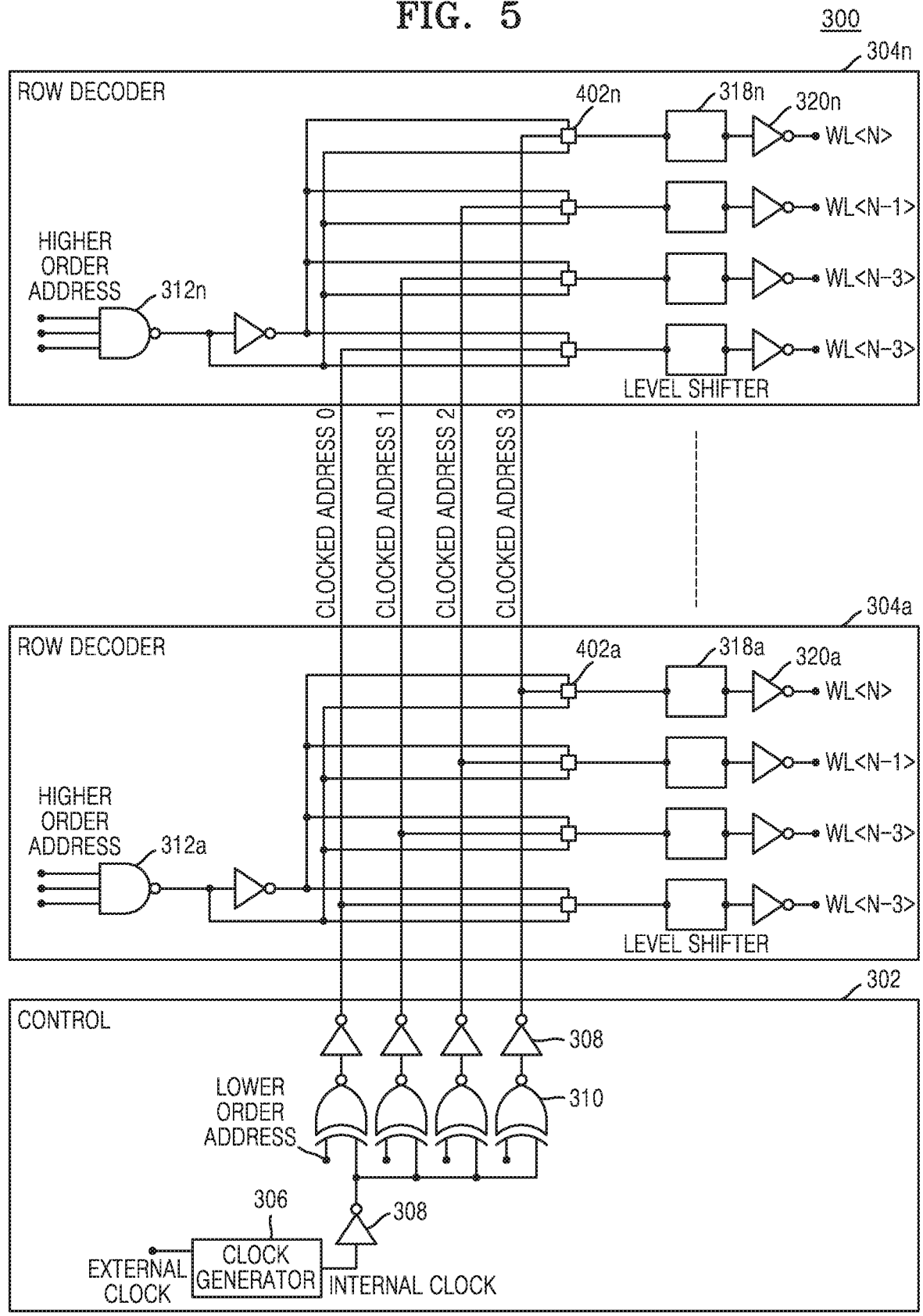
FIG. 5 illustrates a circuit diagram of word line decoder implemented for combing lower order address signals with higher order address signals using transmission gates, according to example embodiments.

FIG. 5 illustrates a circuit diagram of word line decoder 300 implemented for combing lower order address signals with higher order address signals using plurality of transmission gates 402a-n, according to example embodiments. In an example embodiment, the plurality of transmission gates 402a-n may be configured to receive the at least two of the lower order clocked address signals and the higher order non-clocked address. In another example embodiment, the plurality of word-line driver circuits 320a-n may be configured to generate the plurality of word-lines based on the address signals received via the transmission gates 402a-n and the level shifter circuits 318a-n. In yet another example embodiment, the lower order clocked address signals are received via the first logic gates 310. In an embodiment, the higher order non-clocked address signals are received via the second logic gate 312a-n. In an example embodiment, the first logic gates may be configured to receive the global clock signal via the global driver circuit 308.

Figure 6:
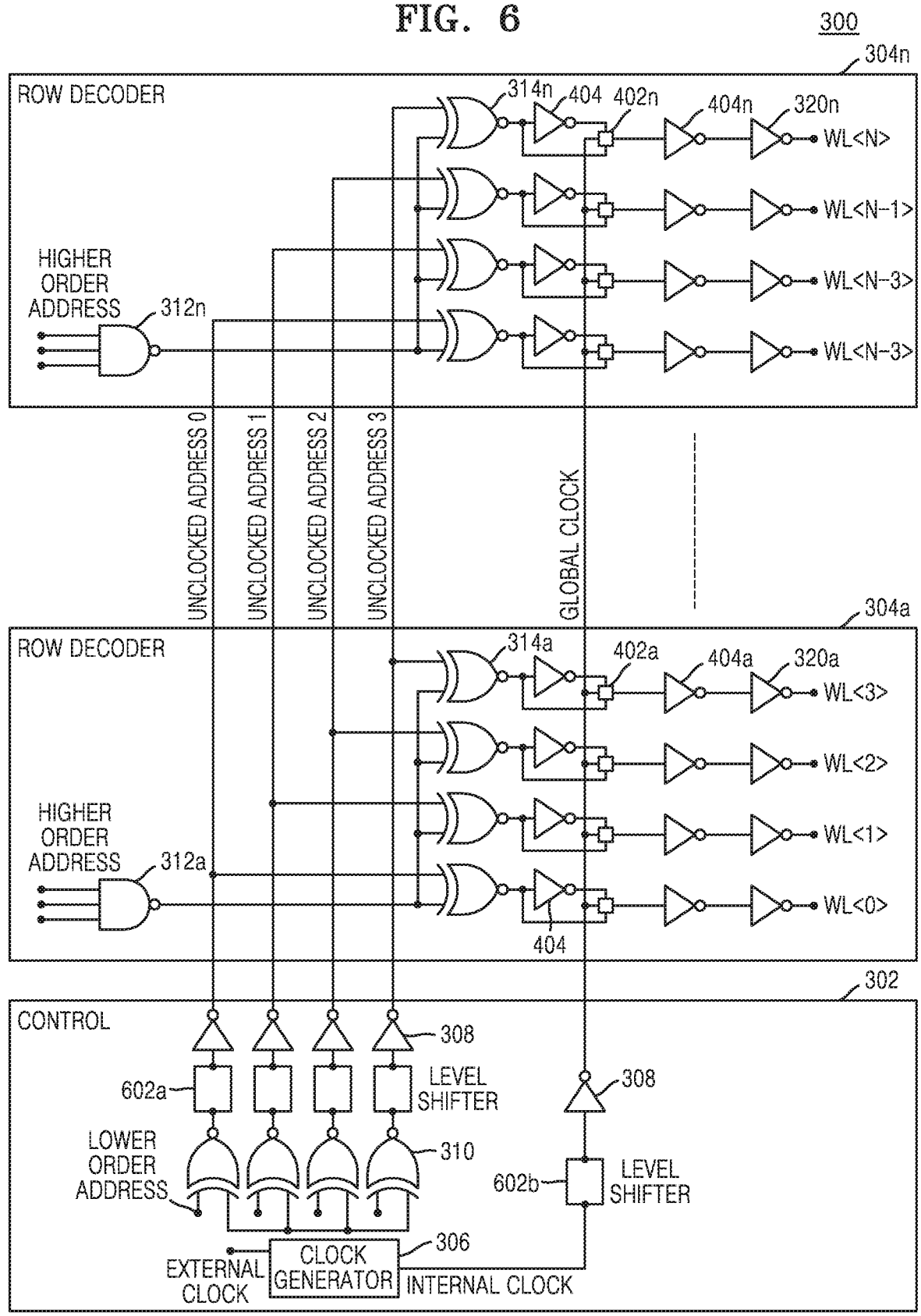
FIG. 6 illustrates a circuit diagram of word line decoder implemented using level shifters before a global driver circuit, according to example embodiments.

FIG. 6 illustrates a circuit diagram of word line decoder 300 implemented using plurality of level shifters 602a between the plurality of first logic gates 310 and third logic gates 314a-n, according to example embodiments. In an example embodiment, the transmission gates are configured to receive at least two of global clock signal and a plurality of controlled address signals, wherein the controlled address signals comprises a lower order non-clocked address signal and a higher order non-clocked address signal. In another example embodiment, the plurality of word-line driver circuits 320a-n may be configured to generate the word-lines based on the controlled address signals received via the plurality of transmission gates 402a-n and the inverters 404. In yet another example embodiment, the plurality of controlled address signals is received via the third logic gates 314a-n. In an example embodiment, the transmission gates 402a-n may receive the global clock signal via a level shifter circuit 602b and the global driver circuit 308. In yet another example embodiment, the third logic gates 314a-n may receive the lower order non-clocked address signals via the level shifter circuits 602a as shown in FIG. 6.

Figure 7:
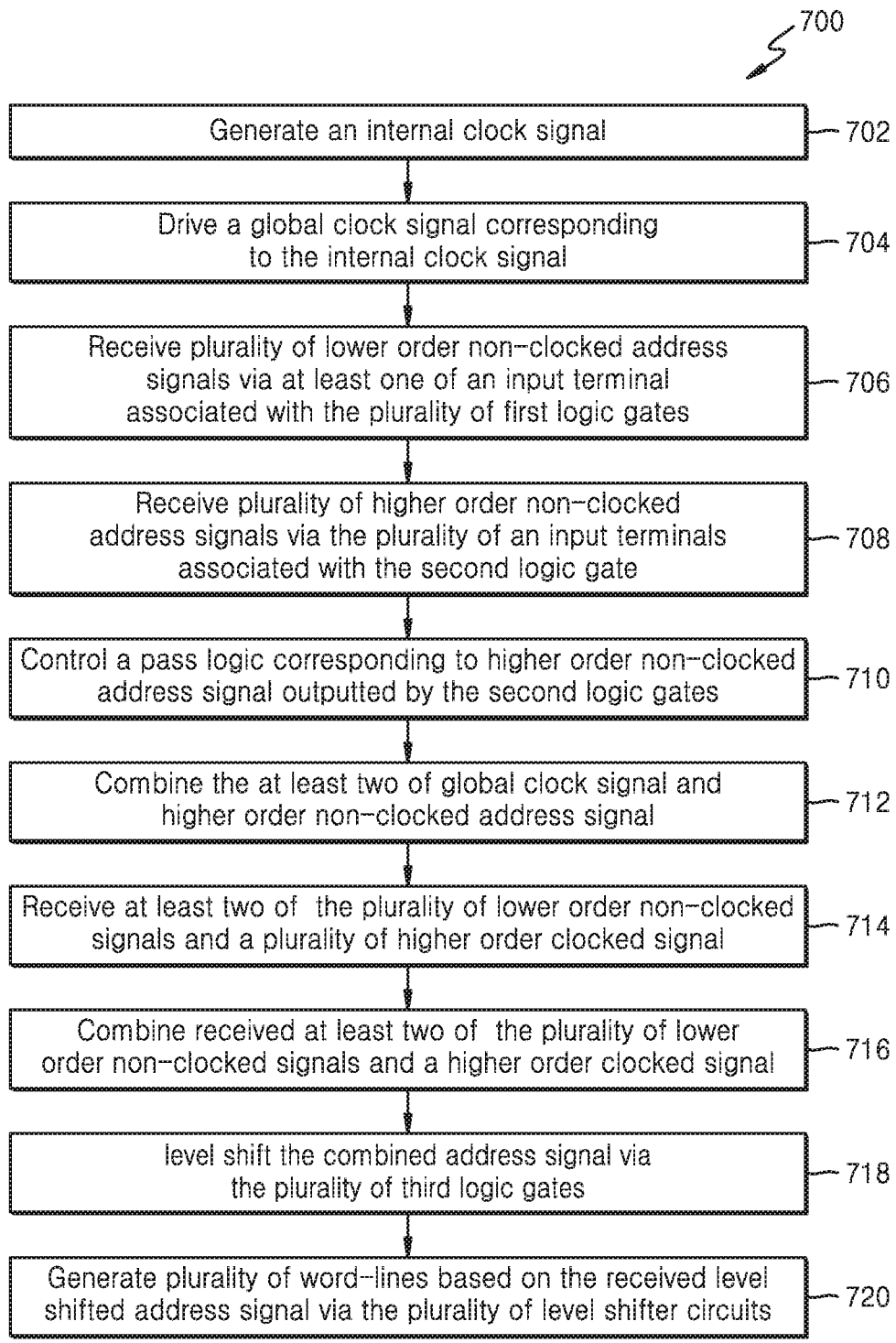
FIG. 7 is a flow chart illustrating a method for decoding word-line using a finFET based SoC memory implemented in finFET based SoC memory, according to example embodiments.

FIG. 7 illustrates a flow chart of method 700 for decoding word-line using a finFET based SoC memory 300 implemented in finFET based SoC memory, according to example embodiments.

At step 702, an internal clock signal may be generated by the clock generator circuit 306. At step 704, a global clock signal corresponding to the internal clock signal is driven, wherein the global clock signal may be generated by the clock generator circuit 306. At step 706, the plurality of lower order non-clocked address signals are received via at least one of an input terminal associated with the plurality of first logic gates 310. At step 708, a plurality of higher order non-clocked address signals are received by a second logic gate 312A-n, via plurality of an input terminals associated with the second logic gate 312A-n. At step 710, a pass logic corresponding to the higher order non-clocked address signal outputted by the second logic gates is controlled. At step 712, the at least two of global clock signal and higher order non-clocked address signal are combined by a transmission gate 316a-n. At step 714, the at least two of plurality of the lower order non-clocked signals and the higher order clocked signal are received by the third logic gates 314a-n. At step 716, the at least two of plurality of the lower order non-clocked signals and the higher order clocked signal are combined by the third logic gates 314a-n. At step 718, the combined address signal is level shifted. At step 720, the plurality of word-lines may be generated by a plurality of word-line driver circuits 320a-n, based on the level shifted address signal received via the level shifter circuits 318A-n.

In an example embodiment, the global clock signal is received via the global driver circuit 308, wherein the higher order non-clocked address signals are received via the second logic gate 312A-n, and the higher order non-clocked address signal is outputted for controlling the transmission gate 316a-n. In another example embodiment, the lower order non-clocked address signals are received via the first logic gates 310, wherein the higher order clocked address signal is received via the transmission gate 316a-n. In yet another example embodiment, the transmission gate 316a-n may be configured to receive high order non-clocked address signal via the input terminal associated with the transmission gate 316a-n. In an example embodiment, the transmission gate 316a-n may be configured to receive the global clock via a drain terminal associated with the transmission gate 316a-n.

The various actions in method 700 may be performed in the order presented, in a different order or simultaneously. Further, in some example embodiments, some operations listed in FIG. 7 may be omitted.

Figure 8A:
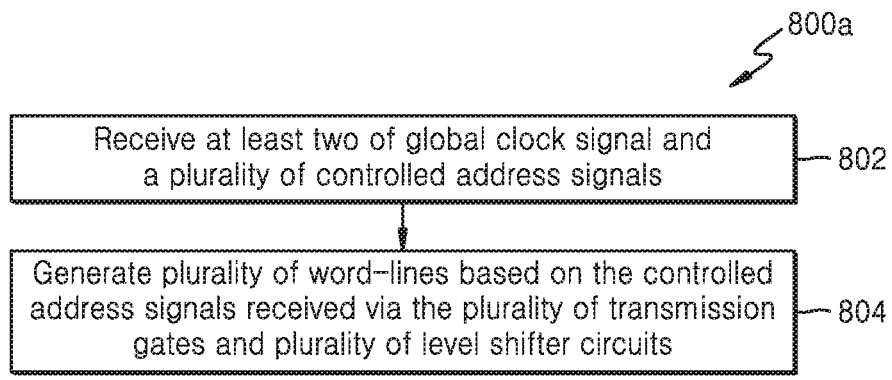
FIG. 8A is a flow chart illustrating a method for decoding word-line using plurality of transmission gates, according to example embodiments.

FIG. 8A illustrates a flow chart of method 800a for decoding word-line using plurality of transmission gates 402a-n, according to example embodiments.

At step 802, the method 800a includes, receiving, by a plurality of transmission gates 402A-n, at least two of the global clock signal and the plurality of address signals, wherein the plurality of address signals comprises the lower order non-clocked address signals and the higher order non-clocked address signal. At step 804, the method 800a includes, generating, by the plurality of word-line driver circuits 320a-n, a plurality of word-lines based on the address signals received via the transmission gates 402A-n and the level shifter circuits 318A-n.

In an example embodiment, the plurality of address signals are received via the third logic gates 314a-n. In another example embodiment, the plurality of lower order non-clocked address signals are received, by the third logic gates 314a-n, via the first logic gates 310. In yet another example embodiment, the higher order non-clocked address signal is received, by the third logic gates 314a-n, via the second logic gate 312A-n.

The various actions in method 800a may be performed in the order presented, in a different order or simultaneously. Further, in some example embodiments, some actions listed in FIG. 8A may be omitted.

Figure 8B:
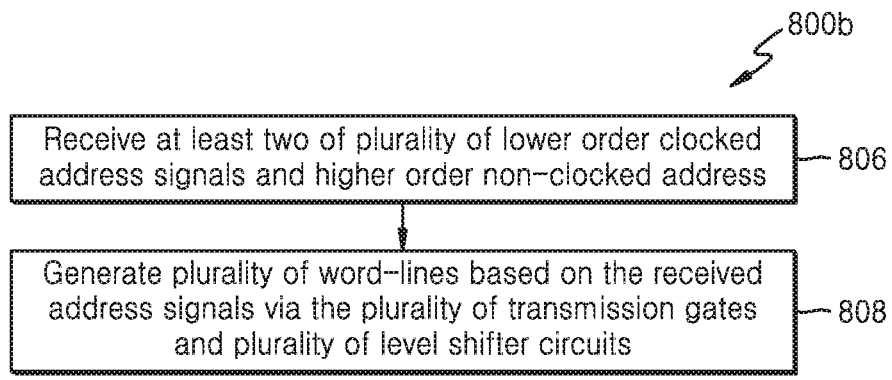
FIG. 8B illustrates a flow chart of method for combing lower order address signals with higher order address signals using transmission gates for generating word-lines, according to example embodiments.

FIG. 8B illustrates a flow chart of method 800b for combing lower order address signals with higher order address signals using transmission gates 402a-n to generate word-lines, according to example embodiments.

At step 806, the method 800b includes, receiving, by the plurality of transmission gates 402a-n, at least two of the plurality of lower order clocked address signals and the higher order non-clocked address. At step 808, the method 800b includes, generating word-lines by the word-line driver circuits 320a-n, based on the address signals received via the transmission gates 402a-n and the level shifter circuits 318a-n.

In an example embodiment, the lower order clocked address signals are received via the first logic gates 310. In another example embodiment, the higher order non-clocked address signals are received via the second logic gate 312a-n. In yet another embodiment, the global clock signal is received by the first logic gates 310, via the global driver circuit 308.

The various actions in method 800b may be performed in the order presented, in a different order or simultaneously. Further, in some example embodiments, some actions listed in FIG. 8B may be omitted.

Figure 8C:
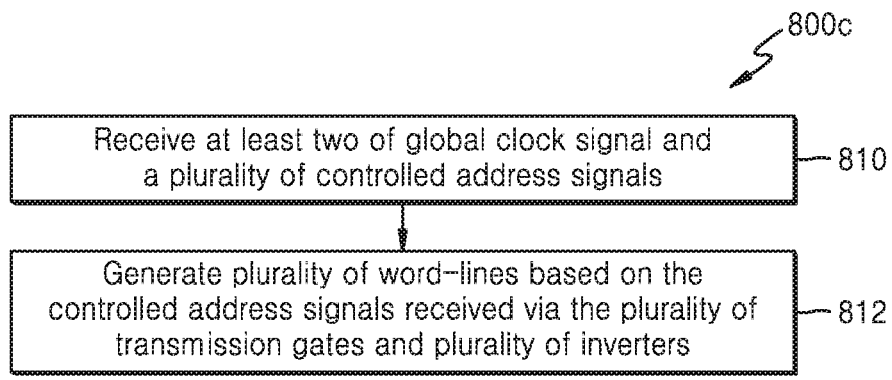
FIG. 8C illustrates a flow chart of method for decoding word-lines using level shifters before a global driver circuit, according to example embodiments.

FIG. 8C illustrates a flow chart of method 800c for decoding word-lines using level shifters 602a between the plurality of first logic gates 310 and third logic gates 314a-n, according to example embodiments.

At step 810, the method 800c includes receiving, by the transmission gates 402a-n, at least two of the global clock signal and the address signals, wherein the address signals comprise the lower order non-clocked address signal and the higher order non-clocked address signal. At step 812, the method 800c includes, generating word-lines by the plurality of word-line driver circuits 320a, based on the address signals received via the transmission gates 402a-n and the inverters 404.

In an example embodiment, the address signal is received via the third logic gates 314a-n. In another embodiment, the transmission gates 402a-n receives the global clock signal via the level shifter circuit 602a and the global driver circuit. In yet another example embodiment, the third logic gates 314a-n receives the lower order non-clocked address signals via the level shifter circuits 602a.

The various actions in method 800c may be performed in the order presented, in a different order or simultaneously. Further, in some example embodiments, some actions listed in FIG. 8C may be omitted.

Example embodiments herein may achieve 4% to 5% gain in performance in 10 nm Ultra High Speed Register file compiler. The example embodiments herein may provide a single metal track to drive clock signal for reducing the area consumption in semiconductor memories. The wide metal track may increase the performance gain by reducing the resistance. Example embodiments herein may reduce the area consumption in control block due to less number of clock drivers. The example embodiments herein may have low capacitance on clock signal due to less drain capacitance in finFET.

Example embodiments herein may have single global driver and single metal track for clock signal. The example embodiments herein may have 4 gate days and one transmission gate delay. The three stage gate delay is with respect to global driver, first logic gates and flowed by global drivers/inverters in the control block 302. The fourth stage gate delay is at third logic gates in row decoder block.

Example embodiments herein may have a total device capacitance of 55 fF. The total drain capacitance per row decoder 304a-n may be 0.28 fF. The parasitic capacitance per row decoder block 304a-n may be 0.58 fF and the total capacitance per row decoder block 304a-n may be 0.86 fF.

The foregoing description of the specific example embodiments will reveal the general nature of the example embodiments herein that others may, by applying current knowledge, readily modify and/or adapt for various applications such specific example embodiments without departing from the generic concept, and, therefore, such adaptations and modifications should and are intended to be comprehended within the meaning and range of equivalents of the disclosed embodiments, and the appended claims. It is to be understood that the phraseology or terminology employed herein is for the purpose of description and not of limitation. Therefore, while the example embodiments herein have been described in terms of embodiments, those skilled in the art will recognize that the example embodiments herein may be practiced with modification within the spirit and scope of the example embodiments as described herein, and as provided in the appended claims.

What is claimed is:

1. A fin-Field Effect Transistor (fin-FET) based system on chip (SoC) memory comprising:
   a control block comprising:
      a clock generator circuit configured to generate an internal clock signal using an external clock signal received via an input node;
      a global driver circuit coupled to the clock generator circuit and configured to drive a global clock signal corresponding to the internal clock signal; and
   a plurality of first logic gates configured to receive a plurality of lower order non-clocked address signals via at least one input terminal associated with the plurality of first logic gates, wherein the plurality of lower order non-clocked address signals are non-clocked address signals; and
a plurality of row decoder blocks configured to receive an input from the control block,
each of the plurality of row decoder blocks comprising:
a second logic gate configured to receive a plurality of higher order non-clocked address signals via a plurality of input terminals associated with the second logic gate;
a transmission gate configured to combine at least two of the global clock signal and the plurality of higher order non-clocked address signals, wherein the global clock signal is received via the global driver circuit and the plurality of higher order non-clocked address signals is received via the second logic gate;
a plurality of third logic gates configured to receive at least two of the plurality of lower order non-clocked address signals and a plurality of higher order clocked address signals, to output a combined lower order address and higher order address along with the global clock signal, wherein the plurality of lower order non-clocked address signals is received via the plurality of first logic gates and the plurality of higher order clocked address signal is received via the transmission gate;
a plurality of level shifter circuits configured to receive the output of the plurality of third logic gates, and configured to output at least one of a translated logic level and a translated voltage level; and
a plurality of word-line driver circuits configured to generate a plurality of word-lines based on the output of plurality of level shifter circuits.

2. The fin-FET based SoC memory as claimed in claim 1, wherein the transmission gate is configured to receive the plurality of higher order non-clocked address signals via at least two of an input terminal associated with the transmission gate.

3. The fin-FET based SoC memory as claimed in claim 1, wherein the transmission gate is configured to receive the global clock signal via a drain terminal associated with the transmission gate.

4. The fin-FET based SoC memory as claimed in claim 1, further comprising a plurality of inverters, wherein the plurality of lower order non-clocked address signals are transmitted to the plurality of third logic gates via at least one of the plurality of inverters.

5. The fin-FET based SoC memory as claimed in claim 1, wherein the higher order non-clocked address signal is configured to control the transmission gate.

6. The fin-FET based SoC memory as claimed in claim 1, wherein each of the plurality of row decoder blocks further comprise:
a plurality of transmission gates configured to receive at least two of the global clock signal and a plurality of address signals, wherein the plurality of address signals comprise a plurality of lower order non-clocked address signals and a higher order non-clocked address signal; and
the plurality of word-line driver circuits configured to generate the plurality of word-lines based on the plurality of address signals received via the plurality of transmission gates and the plurality of level shifter circuits.

7. The fin-FET based SoC memory as claimed in claim 6, wherein the plurality of lower order non-clocked address signals are received by the plurality of third logic gates via the plurality of first logic gates.

8. The fin-FET based SoC memory as claimed in claim 6, wherein the higher order non-clocked address signal is received by the plurality of third logic gates via the second logic gate.

9. The fin-FET based SoC memory as claimed in claim 1, wherein each of the plurality of row decoder blocks further comprise:
the plurality of transmission gates configured to receive at least two of a plurality of lower order clocked address signals and the higher order non-clocked address signal; and
the plurality of word-line driver circuits configured to generate the plurality of word-lines based on the address signals received via the plurality of transmission gates and the plurality of level shifter circuits.

10. The fin-FET based SoC memory as claimed in claim 9, wherein the plurality of lower order clocked address signals are received via the plurality of first logic gates.

11. The fin-FET based SoC memory as claimed in claim 9, wherein the plurality of higher order non-clocked address signal are received via the second logic gate.

12. The fin-FET based SoC memory as claimed in claim 9, wherein the plurality of first logic gates are configured to receive the global clock signal via the global driver circuit.

13. The fin-FET based SoC memory as claimed in claim 1, wherein each of the plurality of row decoder blocks further comprise:
the plurality of transmission gates configured to receive at least two of the global clock signal and the plurality of address signals, wherein the plurality of address signals comprise a plurality of lower order non-clocked address signals, and a higher order non-clocked address signal; and
the plurality of word-line driver circuits configured to generated plurality of word-lines based on the address signals received via the plurality of transmission gates and the plurality of inverters.

14. The fin-FET based SoC memory as claimed in claim 13, wherein the plurality of address signals are received via the plurality of third logic gates.

15. The fin-FET based SoC memory as claimed in claim 13, wherein the plurality of transmission gates are configured to receive the global clock signal via a level shifter circuit and the global driver circuit.

16. The fin-FET based SoC memory as claimed in claim 13, wherein the plurality of third logic gates are configured to receive the plurality of lower order non-clocked address signals via the plurality of level shifter circuits.

17. A method for performing decoding in a fin-Field Effect Transistor (fin-FET) based system on chip (SoC) memory, the method comprising:
generating, by a clock generator circuit, an internal clock signal;
driving, by a global driver circuit, a global clock signal corresponding to the internal clock signal;
receiving, by a plurality of first logic gates, a plurality of lower order non-clocked address signals via at least one of an input terminal associated with the plurality of first logic gates;
receiving, by a second logic gate, a plurality of higher order non-clocked address signals via a plurality of input terminals associated with the second logic gate;
controlling, by the second logic gate, a pass logic corresponding to a higher order non-clocked address signal outputted by the second logic gates;

combining, by a transmission gate, the at least two of the global clock signal and the higher order non-clocked address signal;

receiving, by a plurality of third logic gates, at least two of the plurality of lower order non-clocked signals and the plurality of higher order clocked address signal;

combining, by the plurality of third logic gates, the received at least two of plurality of lower order non-clocked signals and a higher order clocked signal;

level shifting, by a plurality of level shifter circuits, the combined address signal via the plurality of third logic gates; and generating, by a plurality of word-line driver circuits, plurality of word-lines based on the level shifted address signal received via the plurality of level shifter circuits.

18. The method as claimed in claim 17, further comprising:

receiving, by a plurality of transmission gates, at least two of the global clock signal and a plurality of address signals, wherein the plurality of address signals comprise plurality of lower order non-clocked address signals and a higher order non-clocked address signal; and generating, by the plurality of word-line driver circuits, plurality of word-lines based on the address signals, received via the plurality of transmission gates and the plurality of level shifter circuits.

19. The method claimed in claim 17, further comprising:

receiving, by the plurality of transmission gates, at least two of a plurality of lower order clocked address signals and the higher order non-clocked address signal; and generating, by the plurality of word-line driver circuits, the plurality of word-lines based on the address signals received via the plurality of transmission gates and plurality of level shifter circuits.

20. The method claimed in claim 17, further comprising:

receiving, by the plurality of transmission gates, at least two of the global clock signal and the plurality of address signals, wherein the plurality of address signals comprise lower order non-clocked address signals and higher order non-clocked address signal; and generating, by the plurality of word-line driver circuits, plurality of word-lines based on the address signals received via the plurality of transmission gates and the inverters.

* * * * *